(12) United States Patent
Liao et al.

(10) Patent No.: US 11,809,084 B2
(45) Date of Patent: *Nov. 7, 2023

(54) RADIATION SOURCE SUPPLY SYSTEM FOR LITHOGRAPHIC TOOLS

(71) Applicant: Taiwan Semiconductor Manufacturing Co., Ltd., Hsinchu (TW)

(72) Inventors: Chi-Hung Liao, Hsinchu (TW); Yueh Lin Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,204

(22) Filed: Jul. 26, 2022

(65) Prior Publication Data

US 2022/0357664 A1 Nov. 10, 2022

Related U.S. Application Data

(60) Continuation of application No. 17/233,090, filed on Apr. 16, 2021, now Pat. No. 11,435,669, which is a continuation of application No. 16/708,325, filed on Dec. 9, 2019, now Pat. No. 11,003,087, which is a division of application No. 16/141,406, filed on Sep. 25, 2018, now Pat. No. 10,514,607.

(60) Provisional application No. 62/723,870, filed on Aug. 28, 2018.

(51) Int. Cl.
*G03F 7/00* (2006.01)
*G03F 7/20* (2006.01)

(52) U.S. Cl.
CPC ............ *G03F 7/7015* (2013.01); *G03F 7/702* (2013.01); *G03F 7/70025* (2013.01)

(58) Field of Classification Search
CPC .... G03F 7/7015; G03F 7/70025; G03F 7/702; G03F 7/70008; G03F 7/70991; G03F 7/70058; G03F 7/70191
See application file for complete search history.

(56) References Cited

U.S. PATENT DOCUMENTS

| | | | |
|---|---|---|---|
| 10,514,607 B1* | 12/2019 | Liao | G03F 7/70025 |
| 11,003,087 B2 | 5/2021 | Liao et al. | |
| 2003/0002024 A1* | 1/2003 | Motegi | G03B 27/72 355/71 |
| 2003/0156268 A1 | 8/2003 | Nagasaka et al. | |
| 2004/0101245 A1 | 5/2004 | Yahagi et al. | |
| 2007/0242363 A1 | 10/2007 | Noboru et al. | |
| 2011/0216301 A1 | 9/2011 | De Lange et al. | |
| 2014/0253990 A1 | 9/2014 | Perkins | |

* cited by examiner

*Primary Examiner* — Hung V Nguyen

(74) *Attorney, Agent, or Firm* — Seed IP Law Group LLP

(57) ABSTRACT

Embodiments described herein provide a lithographic system having two or more lithographic tools connected to a radiation source using two or more variable attenuation units. In some embodiments, the variable attenuation unit reflects a portion of the received light beam to the lithographic tool attached thereto and transmits a remaining portion of the received light beam to the lithographic tools downstream. In some embodiments, the radiation source includes two or more laser sources to provide laser beams with an enhanced power level and which can prevent operation interruption due to laser source maintenances and repair.

20 Claims, 4 Drawing Sheets

US 11,809,084 B2

RADIATION SOURCE SUPPLY SYSTEM FOR LITHOGRAPHIC TOOLS

BACKGROUND

In semiconductor manufacturing, a lithographic apparatus is used to apply patterns onto a substrate by selectively exposing a photoresist layer on the substrate to a radiation beam. The radiation beam is typically generated using a laser radiation source. A lithographic apparatus usually is equipped with a laser radiation source.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
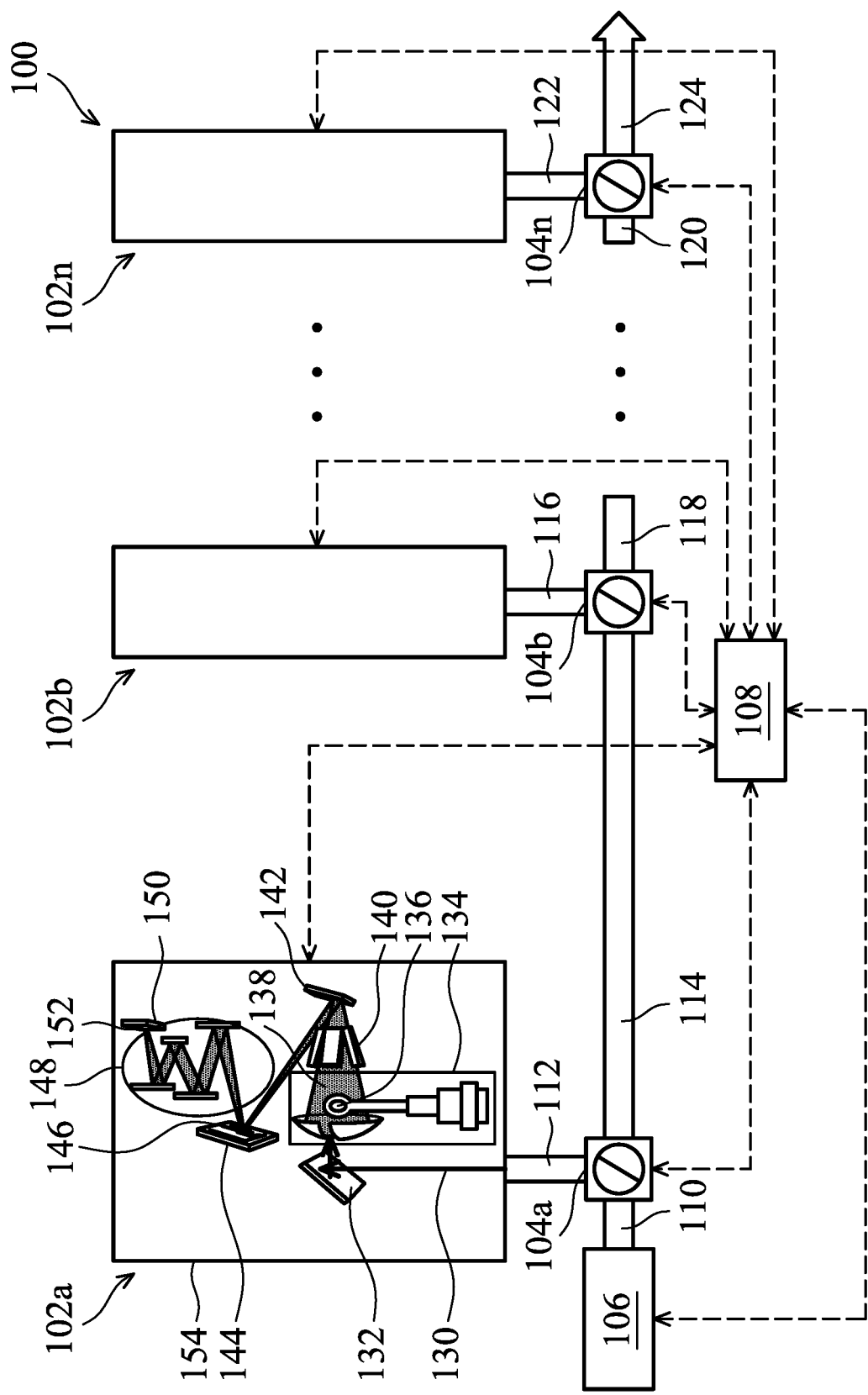
FIG. 1 is a schematic view of a lithographic system according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to providing light beams to one or more lithographic tools. In some embodiments, two or more lithographic tools share a radiation source using two or more beam splitting devices. In some embodiments, the two or more beam splitting devices are variable attenuation units positioned to direct a portion of a received light beam to a lithographic tool attached thereto and direct a remaining portion of the received light beam to a downstream lithographic tool. In some embodiments, the variable attenuation unit reflects a portion of the received light beam to the lithographic tool attached thereto and transmits a remaining portion of the received light beam to the lithographic tools downstream. In some embodiments, the radiation source includes two or more laser sources to provide laser beams with an enhanced power level and which can prevent operation interruption due to laser source maintenance and repair.

FIG. 1 is a schematic view of a lithographic system 100 according to some embodiments. The lithographic system 100 includes two or more lithographic tools 102a, 102b, and 102n. Even though three lithographic tools are shown in the example in FIG. 1, the lithographic system 100 may include any number of lithographic tools. In some embodiments, the lithographic system 100 includes two lithographic tools. In some embodiments, the lithographic system 100 includes more than three lithographic tools. Any number of lithographic tools may be disposed between the lithographic tool 102b and 102n.

Each lithographic tool 102a, 102b, and 102n is connected to a respective variable attenuation unit 104a, 104b, and 104n. The variable attenuation units 104a, 104b, and 104n are connected in series and are connected to a laser radiation source 106. Each variable attenuation unit 104a, 104b, and 104n is configured to receive an input radiation beam, direct a portion of the input radiation beam towards the corresponding lithographic tool, and direct the remaining portion of the input radiation beam towards the downstream attenuation unit if there is a downstream attenuation unit or a dump if no downstream attenuation unit is present.

The lithographic system 100 further includes a controller 108. The controller 108 is connected to the lithographic tools 102a, 102b, and 102n, the variable attenuation units 104a, 104b, and 104n, and the laser radiation source 106. In some embodiments, the controller 108 sends control signals to the laser radiation source 106 and the variable attenuation units 104a, 104b, and 104n to dispatch proper amounts of radiation energy from the laser radiation source 106 to the lithographic tools 102a, 102b, and 102n.

The laser radiation source 106 is configured to generate a laser beam. In some embodiments, the laser radiation source 106 is configured to emit a pulse laser beam. In some embodiments, the laser radiation source 106 includes a seed laser for generating laser beams and an amplification stage including a gain medium used to amplify laser beams. The seed laser emits a pulse laser beam and the amplification stage amplifies the pulse laser beam. In some embodiments, the laser radiation source 106 is configured to emit a pulse laser beam at a constant energy level. In some embodiments, the pulse laser beam has a wavelength, suitable for igniting a plasma, for example a wavelength of about 193 nm or about 248 nm. In some embodiments, the laser radiation source 106 generates a laser beam of a singular wavelength. In some embodiments, the laser radiation source 106 generates two or more laser beams having different wavelengths. In some embodiments, the pulse laser beam has a frequency or repetition rate in a range from greater than 0 kHz to about 16 kHz, for example about 4 kHz. In some embodiments, the laser radiation source 106 generates a pulse laser beam at a power level in a range from greater than 0W to about 160 W, for example, about 40 W.

The laser radiation source 106 is connected to the variable attenuation unit 104a by an optical conduit 110. The optical conduit 110 provides an optical path between the laser radiation source 106 to the variable attenuation unit 104a so that the pulse laser beam generated by the laser radiation source 106 is directed to the variable attenuation unit 104a.

The optical conduit 110 includes a housing defining an optical path therein. In some embodiments, the housing is a linear tubing defining a linear optical path. The tubing may be fabricated from a metal, such as aluminum, and stainless steel. In other embodiments, the optical path defined by the housing is non-linear due to the relative position of the laser radiation source 106 and the variable attenuation unit 104a. In some embodiments, a fiber optics cable is disposed as the housing. The fiber optics cable functions to guide light beams transmitted by the optical conduit 110 through a non-linear path. The fiber optics cable includes one or more strands of optical fibers. The optical fiber is fabricated from silica, glass, quartz, amorphous carbon, a polymer material, such as poly(methyl methacrylate), fluorinated polymers, and poly(perfluoro-butenylvinyl ether), or other suitable material for transmitting light beams. The material of the optical fiber is selected according to the bandgap of the beam of light transmitted therethrough.

An optical conduit 112 connects the variable attenuation unit 104a to the lithographic tool 102a providing an optical path therebetween. An optical conduit 114 connects the variable attenuation unit 104a to the variable attenuation unit 104b positioned downstream providing an optical path between the variable attenuation units 104a, 104b. In some embodiments, the optical conduits 112, 114 are the same as or similar to the optical conduit 110 described above.

The variable attenuation unit 104a is configured to receive an input light beam, direct a variable portion of the input light beam to the optical conduit 112, and direct a remainder of the input light beam to the optical conduit 114. The variable attenuation unit 104a includes an optical attenuator used to reduce the power level of an optical input. In some embodiments, the variable attenuation unit 104a includes a continuously variable optical attenuator. In other embodiments, the variable attenuation unit 104a includes a stepwise variable attenuator.

Figure 2:
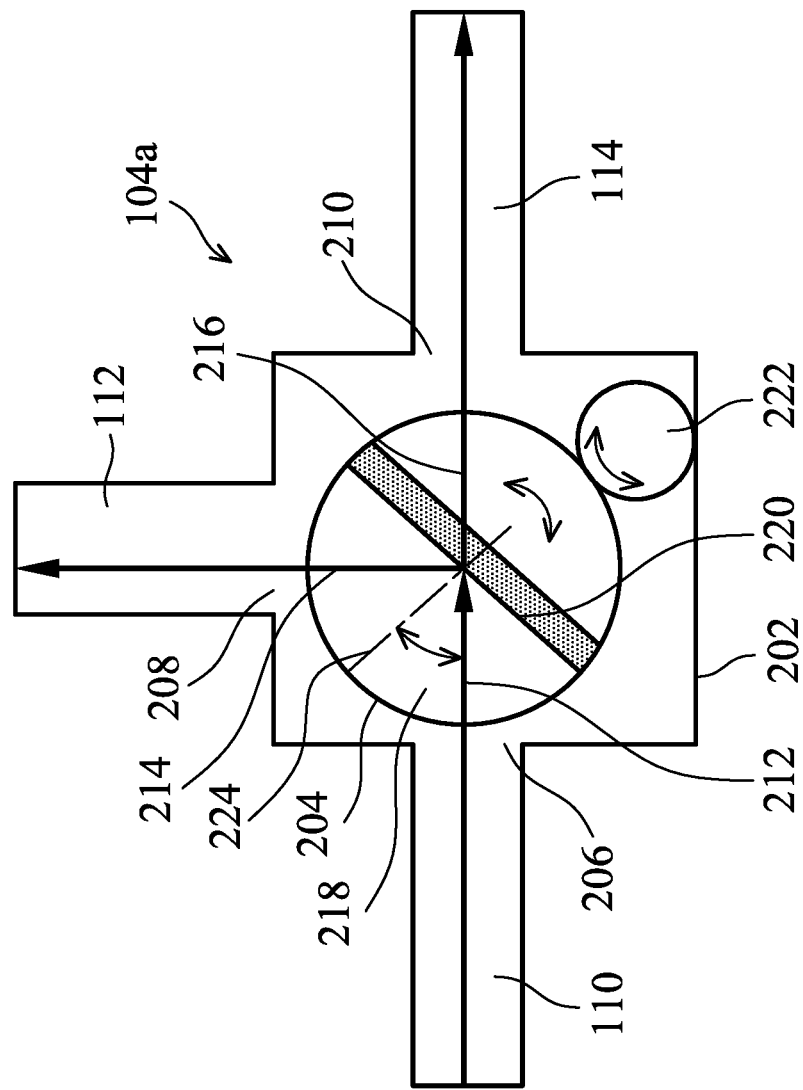
FIG. 2 is a schematic view of a variable attenuation assembly according to some embodiments.

FIG. 2 schematically illustrates an example embodiment of the variable attenuation unit 104a. The variable attenuation unit 104a includes a housing 202 having an inlet port 206, a first outlet port 208, and a second outlet port 210. The optical conduit 110 is connected to the inlet port 206. The optical conduit 112 is connected to the first outlet port 208. The optical conduit 114 is connected to the second outlet port 210. A variable attenuator 204 is disposed in the housing 202. In some embodiments, the first outlet port 208 is a reflection outlet port configured to provide an optical path for a reflected portion of the light beam received from the inlet port 206, while the second outlet port 210 is a transmission outlet port configured to provide an optical path for a transmitted portion of the light beam received from the inlet port 206.

In some embodiments, the variable attenuator 204 is configured to reduce power level of an incident light beam by reflection. In FIG. 2, the variable attenuator 204 includes a reflector 220 and an actuator 222 configured to rotate the reflector 220. During operation, an incident light beam 212 from the optical conduit 110 is directed to the reflector 220 through the inlet port 206. The incident light beam 212 is directed to the reflector 220 at an incident angle 218. The incident angle 218 is defined by the angle between the incident light beam 212 and the normal line 224 of a reflecting surface of the reflector 220. (The normal line 224 is the line that passes through the point of incidence of the incident light beam 212 and is perpendicular to the reflecting surface of the reflector 220 at the point of incidence).

The actuator 222 is coupled to the reflector 220 to adjust the incident angle 218. For example, the actuator 222 rotates the reflector 220 relative to the inlet port 206 to adjust the incident angle 218. In some embodiments, the actuator 222 may move the inlet port 206 relative to the reflector 220 to adjust the incident angle 218. The actuator 222 is any suitable actuating device controllable by a control signal, such as an electric motor, a hydraulic cylinder or fluid motor, a pneumatic actuator, a magnetic actuator, a thermal actuator, a mechanical device, or the like.

Upon being incident on the reflector 220, a portion of the incident light beam 212, a reflected light beam 214, is reflected by the reflector 220 while another portion of the incident light beam 212, a transmitted light beam 216, is transmitted through the reflector 220. The reflected light beam 214 is directed to the optical conduit 112 through the first outlet port 208 while the transmitted light beam 216 is directed to the optical conduit 114 through the second outlet port 210.

In some embodiments, the reflector 220 is made of a transparent material that exhibits some amount of Fresnel reflection relative to the medium, such as air, from which the incident light beam 212 travels. In some embodiments, the reflector 220 is formed from a polymer, an optic fiber, and a lens. In the variable attenuation unit 104a, light beams transmitted through the reflector 220 can be attenuated because a certain amount of the power of light beams propagates with the reflected beams. In this case, a portion of the incident light beam 212 propagates with the reflected light beam 214 so the transmitted light beam 216 is attenuated from the incident light beam 212.

In some embodiments, the reflector 220 is a plate having parallel reflecting surfaces. The amount of attenuation or the amount of power in the reflected light beam 214 is varied by variation of the incident angle 218 of the incident light beam 212. A larger incident angle 218 corresponds to a larger amount of attenuation of the transmitted light beam 216 and/or the higher power in the reflected light beam 214. In some embodiments, the power of the reflected light beam 214 is in a range from 0% to about 50% of the power of the incident light beam 212, while the power of the transmitted light beam 216 is in a range from about 50% to about 100% of the power of the incident light beam 212. In some embodiments, the incident angle 218 is a range between about 45 degree to about 90 degree. In some embodiments, the reflector 220 may be a transparent device with nonparallel surfaces, such as a prism. In some embodiments, the first outlet port 208 is sufficiently wide to capture the reflected light beam 214 while the incident angle 218 varies.

As shown in FIG. 2, the variable attenuation unit 104a receives the incident light beam 212 from a light source, for example, the laser radiation source 106, reflects a portion of the incident light beam 212 to the first outlet port 208 in the form of the reflected light beam 214, and transmits a portion of incident light beam 212 to the second outlet port 210 in the form of the transmitted light beam 216.

Referring to FIG. 1, the variable attenuation unit 104a directs the reflected light beam 214 to the lithographic tool 102a and the transmitted light beam 216 to the variable attenuation unit 104b positioned downstream. In some embodiments, the variable attenuation unit 104a may be connected in a manner to direct the transmitted light beam 216 to the lithographic tool 102a and the reflected light beam 214 to the variable attenuation unit 104b positioned downstream.

The variable attenuation units 104b and 104n are connected to the variable attenuation unit 104a in series. In some embodiments, one or more attenuation units are connected in series between the variable attenuation units 104b and 104n. In some embodiments, the variable attenuation units 104b and 104n are directly connected. The variable attenuation units 104b, 104n and other variable units connected in between are similar in structure to the variable attenuation unit 104a. Like the variable attenuation unit 104a, each of the variable attenuation units 104b, 104n and other variable units connected in between is also configured to capture a portion of an input light beam and direct the captured light beam to a lithographic tool. In some embodiments, the captured light beam is a reflected light beam. In other embodiments, the capture light beam is a transmitted light beam.

The variable attenuation unit 104b is connected to the variable attenuation unit 104a by the optical conduit 114. The optical conduit 114 provides an optical path between the variable attenuation units 104a and 104b so that the light beam from the second outlet port 210 of the variable attenuation unit 104a is transmitted to the variable attenuation unit 104b. An optical conduit 116 provides an optical path between the variable attenuation unit 104b and the lithographic tool 102b so that a light beam from an outlet port of the variable attenuation unit 104b is directed to the lithographic tool 102b. An optical conduit 118 extends from the variable attenuation unit 104b to provide an optical path for the light beam from an outlet port of the variable attenuation unit 104b. In some embodiments, the optical conduit 118 is connected to an inlet port of a downstream variable attenuation unit connected to a lithographic tool. In some embodiments, when there is no downstream variable attenuation unit connected to the optical conduit 118, a device designed to absorb energy of an unused light beam from the optical conduit 118, such as a laser beam dump, is connected to the optical conduit 118 to prevent the output light beam from damaging eyes.

An optical conduit 120 provides an optical path between the variable attenuation unit 104n and the variable attenuation unit disposed upstream so that the pulse laser beam output from the upstream variable attenuation unit is directed to the lithographic tool 102n. An optical conduit 122 extends from the variable attenuation unit 104n to provide an optical path for the light beam from an outlet port of the variable attenuation unit 104n. An optical conduit 124 extends from the variable attenuation unit 104n to provide an optical path for the light beam from an outlet port of the variable attenuation unit 104n. In some embodiments, the optical conduit 124 is connected to a beam dump.

The lithographic tools 102a, 102b, and 102n are any suitable exposure tools, also known as scanners or steppers, configured to transfer circuit design patterns to a light sensitive layer on a substrate. Each of the lithographic tools 102a, 102b, and 102n may be an ultra violet (UV) lithographic tool, an immersion lithographic tool, an extreme ultra violet (EUV) lithographic tool, an electron beam lithographic tool, an x-ray lithographic tool, an ion projection lithographic tool, or any suitable exposure tools using laser radiation source to generate a radiation beam for exposure. In some embodiments, the lithographic tools 102a, 102b, and 102n are the same type of lithographic tools having substantially identical designs. In some embodiments, the lithographic tools 102a, 102b, and 102n are different type of lithographic tools.

In FIG. 1, the lithographic tool 102a is an EUV lithographic tool. The lithographic tool 102a receives a laser beam 130 from the variable attenuation unit 104a. In some embodiments, the laser beam 130 is the reflected light beam 214 from the variable attenuation unit 104a. In some embodiments, the laser beam 130 is the transmitted light beam 216 from the variable attenuation unit 104a. In some embodiments, the lithographic tool 102a includes a reflector 132. The reflector 132 is positioned to direct the laser beam 130 towards a radiation source 134. The radiation source 134 is configured to generate an EUV beam 138. During operation, a gas or vapor, for example Xe gas, Li vapor, or Sn vapor is delivered to the radiation source 134, the laser beam 130 is incident on the gas or vapor and ignites a hot plasma 136, and the hot plasma 136 emits radiation in the EUV range producing the EUV beam 138. In some embodiments, the EUV beam 138 has a wavelength in the range from about 5 nm to about 20 nm, for example, a wavelength of about 13.5 nm, about 6.7 nm, or about 6.8 nm.

The lithographic tool 102a further includes a condenser 140. The radiation source 134 emits the EUV beam 138 to the condenser 140. The condenser 140 focuses the EUV beam 138 for patterning. In some embodiments, the lithographic tool 102a includes one more reflectors 142 configured to reflect the EUV beam 138 towards a mask stage 144. During operation, a mask or reticle 146 is secured to the mask stage 144. The reticle 146 has a pattern surface having a pattern to be transferred to a substrate 152. In some embodiments, the mask stage 144 is movable and rotatable to align the reticle 146 for exposure. In some embodiments, the mask stage 144 includes a number of actuators configured to the move the reticle 146 in a number of degrees of freedom, for example, in six degrees of freedom-X, Y, Z, Rx, Ry, and Rz.

The pattern surface of the reticle 146 reflects the EUV beam 138 towards a projection optics module 148. The projection optics module 148 includes a series of mirrors which function as lenses to reduce the size of the pattern carried by the EUV beam 138. During operation, the projection optics module 148 projects the EUV beam 138 towards a substrate 152 secured on a substrate stage 150. In some embodiments, the substrate stage 150 includes a number of actuators configured to the move the substrate 152 in a number of degrees of freedom to focus the EUV beam 138 on the substrate 152 and/or to align the pattern on the reticle 146 with a target portion on the substrate 152. In some embodiments, the substrate stage 150 is configured to move the substrate 152 in six degrees of freedom—X, Y, Z, Rx, Ry, and Rz using any number of actuators, such as six actuators.

The substrate 152 is a semiconductor substrate on which integrated circuit devices are to be formed. In some embodiments, the substrate 152 is a bulk semiconductor substrate (e.g., a wafer), a silicon on insulator (SOI) substrate, or the like. Materials of the substrate 152 can include silicon, silicon germanium, germanium, gallium arsenide, polysilicon, silicon oxide, carbon doped silicon oxide, silicon nitride, glass, and sapphire. It is contemplated that the substrate 152 is not limited to any particular size or shape. In some embodiments, the substrate 152 is a circular substrate having a 200 mm diameter, a 300 mm diameter or other diameters, such as 450 mm, among others. In some embodiments, the substrate 152 is a polygonal, square, rectangular, curved or otherwise non-circular workpiece.

The substrate 152 has a photoresist layer formed thereon. The EUV beam 138 is incident on the radiation sensitive photoresist layer transferring the pattern carried in the EUV beam 138 to the photoresist layer. The photoresist layer may include any suitable photoresist material designed for the EUV wavelength. In some embodiments, the photoresist layer may include a chemically amplified resist (CAR).

Alternatively or additionally, the photoresist layer may include a metal based photoresist. For example, the photoresist layer may include a metal-oxide resist on top of a sacrificial carbon layer, such as spin-on-carbon. The photoresist layer may also be a tri-layer mask having a bottom layer, a middle layer, and a top layer. The bottom layer may be a carbon organic layer. The middle layer may be a silicon-containing carbon layer used to help pattern the bottom layer. The top layer may be any suitable photoresist material designed for exposure to the EUV wavelength.

In some embodiments, the lithographic tool 102*a* includes a housing 154. The housing 154 defines an inner volume. A vacuum pump may be connected to the housing 154 to establish a vacuum environment in the inner volume. The substrate stage 150 is disposed in the housing 154 so that the EUV lithographic process may be performed in a vacuum state. Other components of the lithographic tool 102*a*, such as the radiation source 134, the condenser 140, the mask stage 144, and the projection optics module 148, may be disposed in the housing 154 or in individual housings.

In some embodiments, the lithographic tools 102*a*, 102*b*, and 102*n* in the lithographic system 100 perform lithographic processes independently from one another. In some embodiments, the controller 108 is configured to coordinate the laser radiation source 106 and the variable attenuation units 104*a*, 104*b*, 104*n* to enable lithographic processing in the lithographic tools 102*a*, 102*b*, and 102*n*.

In some embodiments, the controller 108 communicates with the laser radiation source 106 to control generation of pulse laser beam. In some embodiments, the laser radiation source 106 is configured to generate a pulse laser beam at a fixed energy level and a fixed frequency and the controller 108 sends commands to turn on or off the laser radiation source 106. In other embodiments, the controller 108 sends commands to control the energy level and/or frequency of the laser radiation source 106.

In some embodiments, the controller 108 communicates with each of the lithographic tools 102*a*, 102*b*, 102*n*. For example, the controller 108 may obtain information of the process being performed in each lithographic tool 102*a*, 102*b*, 102*n*, such as energy level, time, and duration of laser energy required by the process.

In some embodiments, the controller 108 communicates with each of the variable attenuation units 104*a*, 104*b*, 104*n*. For example, the controller 108 may send command to the variable attenuation units 104*a*, 104*b*, 104*n* to control and/or adjust the incident angle 218, thus adjusting the portion of laser light beam directed to the corresponding lithographic tools.

In some embodiments, the controller 108 is a computer, a programmable logic controller, or the like, having a central processing unit (CPU), memories, input/output ports, and one or more programs operable to perform controlling functions. In some embodiments, the controller 108 is a standalone device. In other embodiments, the controller 108 is a computing device integrated in one of the laser radiation source 106, the lithographic tools 102*a*, 102*b*, 102*n*, and the variable attenuation units 104*a*, 104*b*, 104*n*. In other embodiments, the controller 108 communicates with the laser radiation source 106, the lithographic tools 102*a*, 102*b*, 102*n*, and the variable attenuation units 104*a*, 104*b*, 104*n* by wired and/or wireless communication, for example through via Bluetooth communication, via Internet, via intranet, and/or the like.

Figure 3:
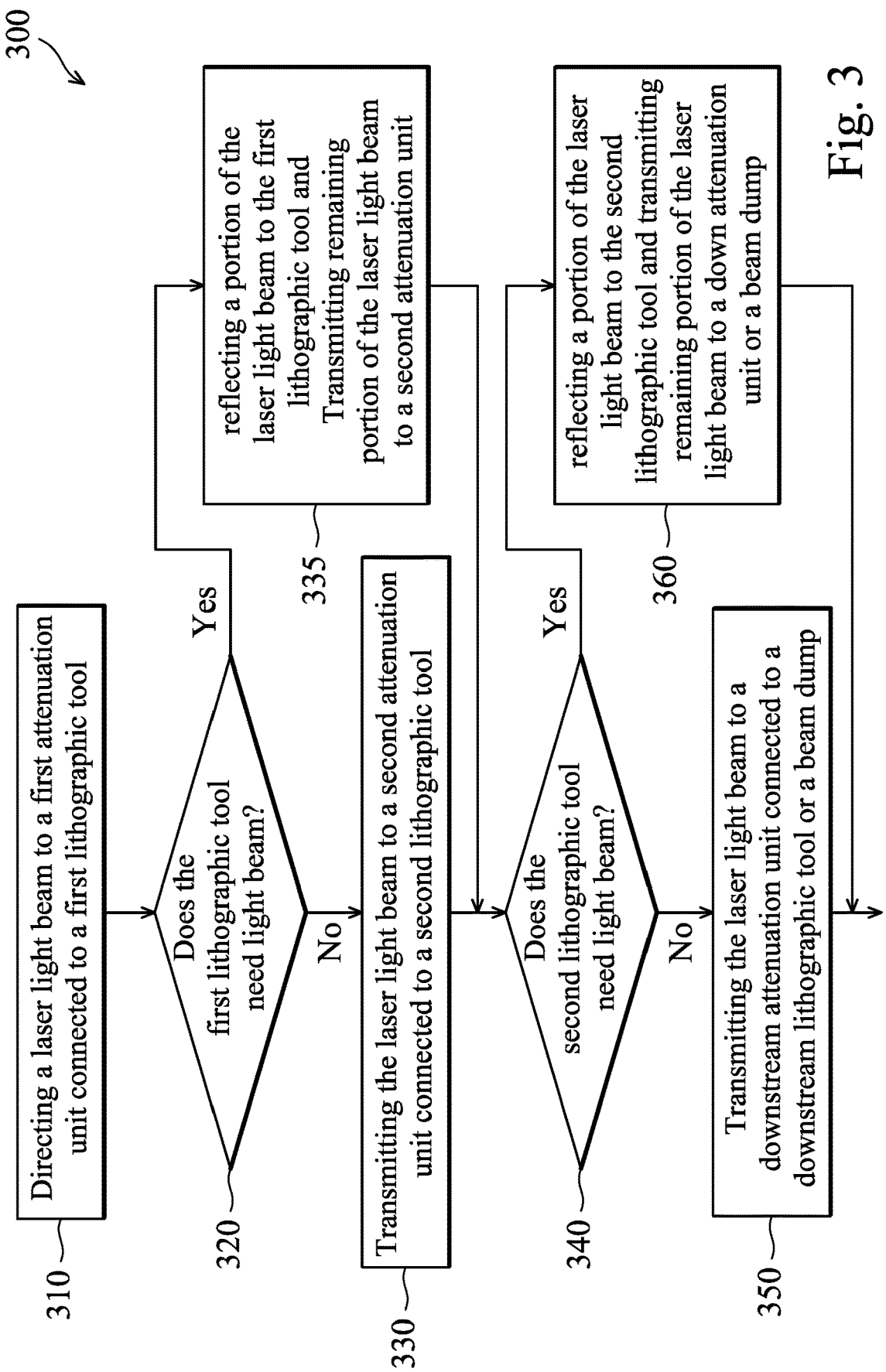
FIG. 3 is a flow chart of a method for performing a lithographic process according to some embodiments.

FIG. 3 is a flow chart of a method 300 for performing a lithographic process according to some embodiments. The method 300 may be performed using lithographic systems having two or more lithographic tools sharing one laser radiation source, such as the lithographic system 100 of FIG. 1.

In operation 310, a laser light beam is generated and directed to a first attenuation unit connected to a first lithographic tool. For example, in the lithographic system 100, a laser light beam is generated by the laser radiation source 106 and directed to the first attenuation unit 104*a* through the optical conduit 110. In some embodiments, the laser light beam is a pulse laser light beam having a frequency or repetition rate in a range between greater than 0 kHz and about 16 kHz, for example about 4 kHz. In some embodiments, the laser light beam has a power level in a range between greater than 0 W to about 160 W, for example, about 40 W. In some embodiments, the laser light beam is generated at all time. In other embodiments, the laser light beam is only generated at moments when one of the lithographic tools in the lithographic system needs the laser light beam as an energy source for the lithographic processing.

In operation 320, the first lithographic tool connected to the first attenuation unit is queried to determine whether the first lithographic tool needs the laser light beam at the moment. A lithographic operation in a lithographic tool, such as the lithographic tool 102*a*, typically includes substrate loading, alignment, exposure, and substrate unloading. For example, during a lithographic operation, a substrate having a photoresist layer is first secured on a substrate stage, the substrate is then aligned with a mask secured in the mask stage. Upon alignment, an exposure is performed to pattern an area on the substrate according to the pattern on the mask. In some lithographic tools, the substrate and the mask realign to pattern another area on the substrate. An exposure is performed after each alignment. The substrate is unloaded from the lithographic tool when all the target regions are patterned. During the lithographic operation, the lithographic tool needs the light beam input only during the exposure process. In operation 320, status of the first lithographic tool is reviewed to determine whether the first lithographic tool needs laser light beam at the moment.

If the first lithographic tool does not need the laser light beam, operation 330 is performed. In operation 330, the first attenuation unit directs the entire laser light beam to a second attenuation unit connected to a second lithographic tool. In some embodiments, the first attenuation unit is similar to the variable attenuation unit 104*a* of FIG. 2. In operation 330, the reflector 220 is adjusted to transmit as much laser light beam as possible, for example nearly 100% of the laser light beam from the inlet port 206 to the second outlet port 210. For example, the reflector 220 is adjusted so the incident angle 218 is about 90° so the reflector 220 does not reflect the incident light beam 212. In some embodiments, in operation 330, the light beam may be directed through a by-pass optical path to pass through the first attenuation unit.

If the first lithographic tool needs the laser light beam, operation 335 is performed. In operation 335, the first attenuation unit directs a portion of the laser light beam received to the first lithographic tool and directs the remaining portion of the laser light beam to the second attenuation unit. A percentage of the laser light beam to be directed to the first lithographic tool in then determined from the power level of the laser light beam received and the amount of laser light beam needed according to the process performed in the first lithographic tool. The power level of the laser light beam received by the first attenuation unit corresponds to the output of the laser radiation source. In some embodiments, the percentage of the laser light beam directed to the first lithographic tool is determined by a system controller, such as the controller 108. In some embodiments, the first attenuation unit reflects the percentage of received laser light beam to the first lithographic tool and transmits the remaining of the received light beam to the second attenuation unit. In other embodiments, the first attenuation unit transmits the percentage of received laser light beam to the first lithographic tool and reflects the remaining of the received light beam to the second attenuation unit.

In some embodiments, the first attenuation unit is similar to the variable attenuation unit 104a. In operation 335, the reflector 220 is adjusted to reflect the percentage of the laser light beam received from the inlet port 206 to the first lithographic tool through the first outlet port 208 and transmit the remaining portion of the laser light beam to the second outlet port 210. In some embodiments, an incident angle is determined according to the percentage of the laser light beam to be reflected. For example, the incident angle is determined using a look-up table of incident angles with corresponding percentages of reflection for the reflector 220. The reflector 220 is adjusted to the incident angle corresponding to the percentage of light beam to be directed to the first lithographic tool.

In operation 335, a lithographic process is performed in the first lithographic tool using the portion of laser light beam directed to the first lithographic tool from the first attenuation unit. For example, a plasma is generated using the laser light beam as energy source. The plasma emits an EUV radiation beam. The EUV radiation beam is impinged to the mask then projected to the substrate to transfer a pattern on the mask to a photoresist layer on the substrate. The laser light beam directed to the first lithographic tool may be used in other lithographic processes, such as UV lithography, immersion lithography, and the likes.

In operation 340, the second lithographic tool connected to the second attenuation unit is queried to determine whether the second lithographic tool needs the laser light beam at the moment.

If the second lithographic tool does not need the laser light beam, operation 350 is performed. In operation 350, the second attenuation unit directs the entire laser light beam received from the first attenuation unit to a downstream attenuation unit connected to a downstream lithographic tool. When there is not a downstream attenuation unit connected to the second attenuation unit, the laser light beam is directed to a beam dump. Similar to operation 330, in operation 350, the reflector in the second attenuation unit is positioned transmit as much laser light beam as possible, for example nearly 100% of the laser light beam, from the inlet port to the second outlet port. In some embodiments, the light beam may be directed through a by-pass optical path to pass through the second attenuation unit.

If the second lithographic tool needs the laser light beam, operation 360 is performed. In operation 360, the second attenuation unit directs a portion of the laser light beam received to the second lithographic tool and directs the remaining portion of the laser light beam to the downstream attenuation unit or the beam dump. A percentage of the laser light beam to be directed to the second lithographic tool in then determined from the power level of the laser light beam received by the second attenuation unit and the amount of laser light beam needed according to the process performed in the second lithographic tool. The power level of the laser light beam received by the second attenuation unit corresponds to the output of the laser radiation source and the percentage of laser light beam directed to the first lithographic tool by the first attenuation unit.

In some embodiments, the percentage of the laser light beam directed to the second lithographic tool is determined by a system controller, such as the controller 108. In some embodiments, the second attenuation unit reflects the percentage of received laser light beam to the second lithographic tool and transmits the remaining of the received light beam to the downstream attenuation unit or the beam dump. In other embodiments, the second attenuation unit transmits the percentage of received laser light beam to the second lithographic tool and reflects the remaining of the received light beam to the downstream attenuation unit or the beam dump.

In some embodiments, the second attenuation unit is similar to the variable attenuation unit 104b. In operation 360, the reflector is adjusted to reflect the percentage of the laser light beam received from the inlet port 206 to the second lithographic tool through the first outlet port 208 and transmit the remaining portion of the laser light beam to the second outlet port 210. In some embodiments, an incident angle is determined according to the percentage of the laser light beam to be reflected. For example, the incident angle is determined using a look-up table of incident angles with corresponding percentages of reflection for the reflector 220. The reflector 220 is adjusted to the incident angle corresponding to the percentage of light beam to be directed to the second lithographic tool.

In operation 360, a lithographic process is performed in the second lithographic tool using the portion of laser light beam directed to the second lithographic tool from the second attenuation unit.

In some embodiments, when the second attenuation unit directs the remaining portion of the laser light beam to a downstream attenuation unit connected to a downstream lithographic tool, operations similar to the operations 340, 350, and 360 may be performed.

Figure 4:
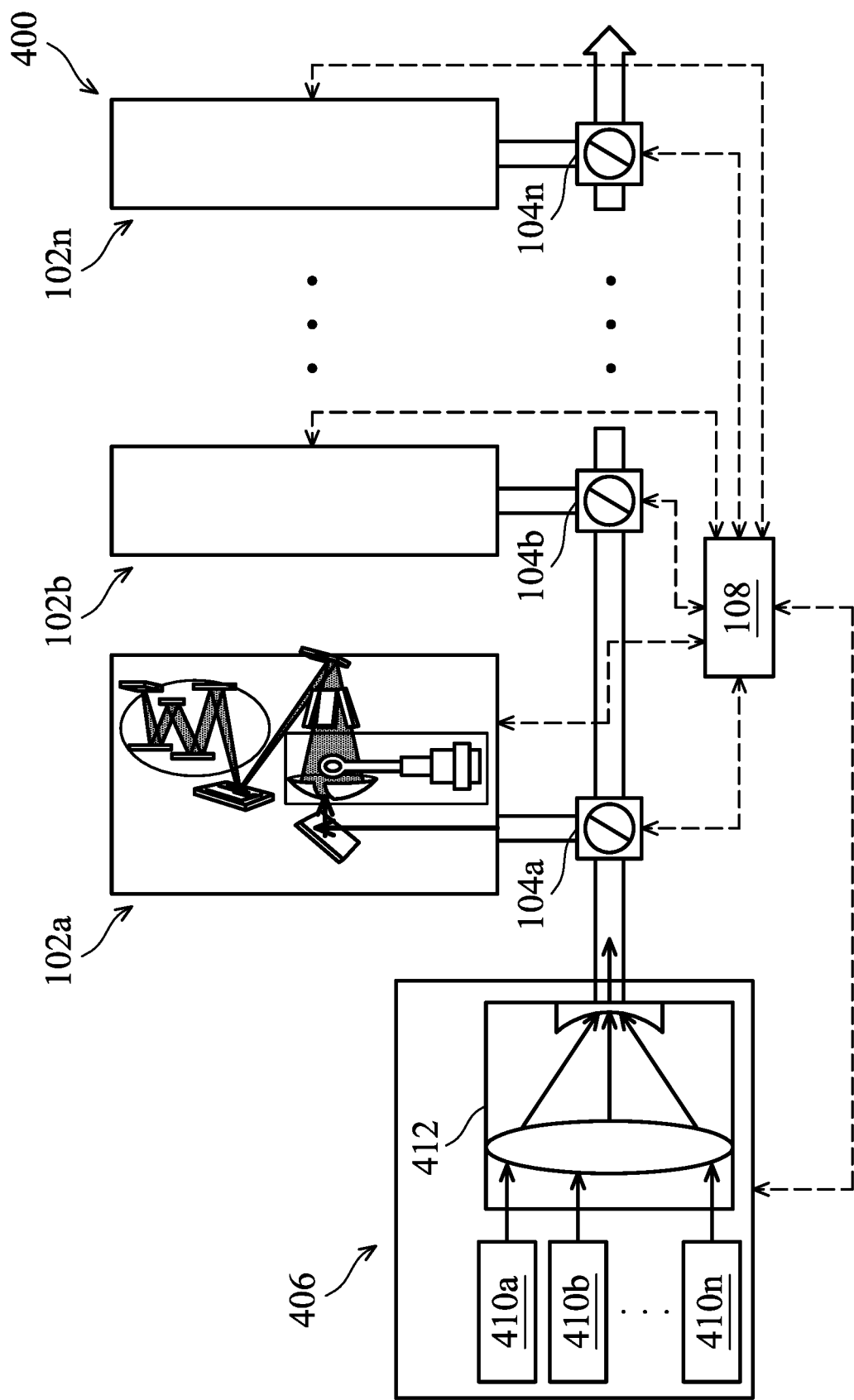
FIG. 4 is a schematic view of a lithographic system according to some embodiments.

FIG. 4 is a schematic view of a lithographic system 400 according to some embodiments. The lithographic system 400 is similar to the lithographic system 100 except that the lithographic system 400 includes a combination laser radiation source 406 in place of the laser radiation source 106. The combination laser radiation source 406 includes two or more laser radiation sources 410a, 410b, 410n and a beam position module 412. Even though three laser radiation sources are shown in FIG. 4, the combination laser radiation source 406 may include any number of laser radiation sources, for example, two, four, or five. In some embodiments, the number of laser radiation sources 410 equals the number of lithographic tools 102 in the lithographic system 400. Each of the two or more laser radiation sources 410a, 410b, 410n may be similar to the laser radiation source 106. The beam position module 412 includes optics configured to combine laser beams from multiple sources and output a single laser light beam. The laser radiation sources 410a, 410b, 410n are positioned before the beam position module 412 in a parallel manner to allow the beam position module 412 to combine the laser light beams.

In some embodiments, each of the laser radiation sources 410a, 410b, 410n operates independently from each other. During operation, two or more of the laser radiation sources 410a, 410b, 410n may be turned on simultaneously to generate a laser beam with increased energy level suitable for the multiple lithographic tools in the lithographic system 400. In some embodiments, the laser radiation sources 410a, 410b, 410n can be turned on at the same time. In some embodiments, the number of laser radiation sources 410 that are turned on may vary according to the processes being performed in the lithographic system 400. More laser radiation sources 410 are turned on when more lithographic tools 102 need laser radiation beam, and fewer laser radiation sources 410 are turned on when less lithographic tools 102 need laser radiation beam, for example.

In some embodiments, each of the laser radiation sources 410*a*, 410*b*, 410*n* is turned off periodically for maintenance while all the lithographic tools 102 operate without interruption. In some embodiments, each of the laser radiation sources 410*a*, 410*b*, 410*n* can be turned off any time for repair and/or maintenance without interrupting operations in the lithographic tools 102.

The lithographic system 400 may be used to perform the method 300 described above. In some embodiments, prior to directing the laser light beam to the first attenuation unit 104*a* in operation 310, the controller 108 sends commands to the combination laser radiation source 406 on a power level requirement according to the processes in the lithographic tools 102. A suitable number of laser radiation source 410*a*, 410*b*, 410*n* are turned on to generate a laser light beam to meet the power level requirement.

Embodiments described herein provide a lithographic system having two or more lithographic tools sharing a laser radiation source. This configuration increases efficiency of the laser radiation source, thus, increasing system throughput. In some embodiments, two or more lithographic tools share a laser radiation source with parallel beam supplied from two or more laser sources. This configuration enables output of laser light beams with enhanced power level. Additionally, arranging laser sources in a parallel manner also prevent operation interruption in the lithographic tools due to laser source maintenances and repair.

Some embodiments provide an apparatus. The apparatus includes a first attenuation unit comprising a first housing having a first inlet port, a first reflection outlet port, and a first transmission outlet port, and a first reflector disposed in the first housing. The first reflector is positioned to receive a first light beam from the first inlet port, reflect a first reflected portion of the first light beam to the first reflection outlet port, and transmit a first transmitted portion of the first light beam to the first transmission outlet port. The apparatus include a first lithographic tool and a first optical conduit connecting the first reflection outlet port and the first lithographic tool to direct the first reflected portion of the first light beam from the first attenuation unit.

Some embodiments provide an apparatus. The apparatus includes a first attenuation unit and a second attenuation unit. The first attenuation unit includes a first inlet port, a first reflection port, a first transmission port, and a first reflector positioned to receive a first light beam from the first inlet port, reflect a portion of the first light beam to the first reflection port, and transmit a portion of the first light beam to the first transmission port. The second attenuation unit includes a second inlet port, a second reflection port, a second transmission port, and a second reflector positioned to receive a second light beam from the second inlet port, reflect a portion of the second light beam to the second reflection port, and transmit a portion of the second light beam to the second transmission port. One of the first transmission port and the first reflection port is connected to the second inlet port by an optical conduit.

Some embodiments provide a method. A laser light beam is directed from a radiation source to a first attenuation unit connected to a first lithographic tool. By the first attenuation unit, a first portion of the laser light beam is directed to the first lithographic tool. By the first attenuation unit, a second portion of the laser light beam is directed to a second attenuation unit connected to a second lithographic tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
 a first attenuation unit comprising:
  a first housing having a first inlet port, a first reflection outlet port and a first transmission outlet port;
  a first reflector disposed in the first housing, which in operation, is positioned to receive a first light beam from the first inlet port, reflect a first reflected portion of the first light beam to the first reflection outlet port and transmit through itself a first transmitted portion of the first light beam to the first transmission outlet port; and
  an actuator coupled to the first reflector, wherein the actuator is operable to rotate the first reflector; and
 a first optical conduit connected to the first reflection outlet port to direct the first reflected portion of the first light beam from the first attenuation unit.

2. The apparatus of claim 1, wherein the actuator is operable to rotate the first reflector to have the incident angle be in a range from 45 degrees to 90 degrees.

3. The apparatus of claim 1, wherein the rotation of the first reflector varies a percentage of the first light beam being reflected by the first reflector.

4. The apparatus of claim 3, wherein the percentage of the first light beam reflected by the first reflector is in a range is from 0% to 50%.

5. The apparatus of claim 1, further comprising:
 a first lithographic tool, and
 wherein the first optical conduit directs the first reflected portion of the first light beam to the first lithographic tool.

6. The apparatus of claim 1, further comprising a radiation source connected to the first inlet port of the first attenuation unit.

7. The apparatus of claim 6, wherein the radiation source comprises:
 two or more laser radiation sources; and
 a beam position module, wherein the beam position module receives laser beams from the two or more laser radiation sources and combines the laser beams to form an output laser beam.

8. An apparatus comprising:
 a first attenuation unit comprising:
  a first housing having a first inlet port, a first reflection outlet port, and a first transmission outlet port; and
  a first reflector disposed in the first housing, which in operation, is positioned to receive a first light beam from the first inlet port, reflect a first reflected portion of the first light beam to the first reflection outlet port, and transmit through itself first transmitted portion of the first light beam to the first transmission outlet port;

a first optical conduit connected to the first reflection outlet port to direct the first reflected portion of the first light beam from the first attenuation unit;
a second attenuation unit comprising:
a second housing having a second inlet port, a second reflection outlet port, and a second transmission outlet port; and
a second reflector disposed in the second housing, which in operation, is positioned to receive a second light beam from the second inlet port, reflect a second reflected portion of the second light beam to the second reflection outlet port, and transmit through itself a second transmitted portion of the second light beam to the second transmission outlet port;
a second optical conduit connected to the second reflection outlet port to direct the second reflected portion of the second light beam from the second attenuation unit; and
a third optical conduit connecting the first transmission outlet port of the first attenuation unit and the second inlet port of the second attenuation unit.

9. The apparatus of claim 8, further comprising:
a first lithographic tool connected to the first reflection port; and
a second lithographic tool connected to the second reflection port.

10. The apparatus of claim 8, further comprising:
a laser radiation source connected to the first inlet port of the first attenuation unit.

11. The apparatus of claim 10, wherein the laser radiation source comprises two or more laser radiation sources connected in a parallel manner.

12. The apparatus of claim 8, wherein the first attenuation unit further comprises a housing, each of the first inlet port, first reflection port, and first transmission port being in the housing.

13. The apparatus of claim 8, wherein the first attenuation unit further comprises an actuator coupled to the first reflector, wherein the actuator is operable to rotate the first reflector.

14. The apparatus of claim 13, wherein the second attenuation unit further comprises an actuator coupled to the second reflector, wherein the actuator is operable to rotate the second reflector.

15. The apparatus of claim 8, wherein the first attenuation unit further comprises an actuator coupled to the first inlet port, wherein the actuator of the first attenuation unit is operable to move the first inlet port relative to the first reflector.

16. The apparatus of claim 8, wherein the second attenuation unit further comprises an actuator coupled to the second inlet port, wherein the actuator of the second attenuation unit is operable to move the second inlet port relative to the second reflector.

17. An apparatus, comprising:
a first attenuation unit comprising:
a first housing having a first inlet port, a first reflection outlet port, and a first transmission outlet port;
a first reflector disposed in the first housing, which in operation, is positioned to receive a first light beam from the first inlet port, reflect a first reflected portion of the first light beam to the first reflection outlet port, and transmit through itself a first transmitted portion of the first light beam to the first transmission outlet port; and
an actuator coupled to the first inlet port, wherein the actuator is operable to move the first inlet port relative to the first reflector to change an incident angle of the first light beam from the first inlet port relative to a reflecting surface of the first reflector; and
a first optical conduit connected to the first reflection outlet port to direct the first reflected portion of the first light beam from the first attenuation unit.

18. The apparatus of claim 17, further comprising a controller, coupled to the actuator of the first attenuation unit, wherein the controller varies the percentage of the first light beam being reflected by the first reflector according to a power level requirement for the first reflected portion of the first light beam.

19. The apparatus of claim 17, further comprising:
a second attenuation unit comprising:
a second housing having a second inlet port, a second reflection outlet port, and a second transmission outlet port;
a second reflector disposed in the second housing, which in operation, is positioned to receive a second light beam from the second inlet port, reflect a second reflected portion of the second light beam to the second reflection outlet port, and transmit through itself a second transmitted portion of the second light beam to the second transmission outlet port;
an actuator coupled to the second inlet port, wherein the actuator is operable to move the second inlet port relative to the second reflector to change an incident angle of the second light beam from the second inlet port relative to a reflecting surface of the second reflector;
a second optical conduit connected to the second reflection outlet port to direct the second reflected portion of the second light beam from the second attenuation unit; and
a third optical conduit connecting the first transmission outlet port of the first attenuation unit and the second inlet port of the second attenuation unit.

20. The apparatus of claim 17, further comprising a radiation source connected to the first inlet port of the first attenuation unit.

* * * * *